United States Patent
Murata

(10) Patent No.: US 6,548,620 B2
(45) Date of Patent: Apr. 15, 2003

(54) EPOXY RESIN COMPOSITION AND PROCESS FOR PRODUCING THE SAME

(75) Inventor: Yasuyuki Murata, Yokkaichi (JP)

(73) Assignee: Japan Epoxy Resins Co., Ltd., Tokyo (JP)

( * ) Notice: Subject to any disclaimer, the term of this patent is extended or adjusted under 35 U.S.C. 154(b) by 0 days.

(21) Appl. No.: 09/977,415

(22) Filed: Oct. 16, 2001

(65) Prior Publication Data

US 2002/0077422 A1 Jun. 20, 2002

(30) Foreign Application Priority Data

Oct. 23, 2000 (JP) ........................................ 2000-322630

(51) Int. Cl.[7] .............................................. C08G 65/06
(52) U.S. Cl. ........................... 528/89; 528/94; 528/112; 549/517; 549/522; 549/541; 549/542; 549/544
(58) Field of Search .................................... 549/517, 522, 549/541, 542, 544; 528/89, 94, 112

(56) References Cited

U.S. PATENT DOCUMENTS 5,844,062 A * 12/1998 Cheng ........................ 528/94

FOREIGN PATENT DOCUMENTS

| JP | 61-47725 | 3/1986 |
| JP | 61-268641 | 11/1986 |
| JP | 2-12225 | 3/1990 |

OTHER PUBLICATIONS

C. Zhang, et al., "Synthesis and Characterization of Diglydicyl Ether Epoxy Resin with Biphenyl–4–4'–diol and Epoxy Choloropropane", Polymer Science Division Preprints 42 (2), 222nd National Meeting Chicago, IL, AUg. 26–31, 2001, p. 370, the whole document.

JP 5817077 A (Kanegafuchi Chem KK) 1983–10–07 (Abstract).

* cited by examiner

Primary Examiner—Robert Dawson
Assistant Examiner—D. Aylward
(74) Attorney, Agent, or Firm—Oblon, Spivak, McClelland, Maier & Neustadt, P.C.

(57) ABSTRACT

The present invention provides a tetramethylbiphenyl type high performance epoxy resin composition and a curable epoxy resin composition containing the epoxy resin, useful in electrical and electronic fields and the like. The tetramethylbiphenyl type epoxy resin composition comprises an epoxy resin composition obtained by reacting 4,4'-dihydroxy-3,3',5,5'-tetramethylbiphenyl and an epihalohydrin in the presence of an alkali metal compound. The composition has a content of tetramethyldiphenoquinone of 0.5% by weight or less and a content of a glycidyl compound represented by the following structural formula (1):

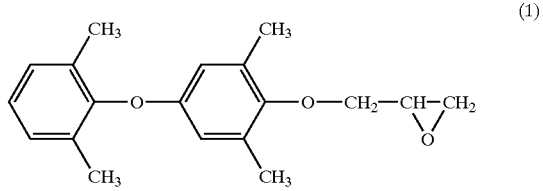

of 0.5% by weight or less. The curable epoxy resin composition contains the epoxy resin composition and a hardener for the epoxy resin.

5 Claims, No Drawings

EPOXY RESIN COMPOSITION AND PROCESS FOR PRODUCING THE SAME

TECHNICAL FIELD OF THE INVENTION

The present invention relates to a tetramethylbiphenyl type high performance epoxy resin composition useful in electrical and electronic fields and the like, a process for producing the high performance epoxy resin composition, and a curable epoxy resin composition using the high performance epoxy resin composition.

PRIOR ART

Because of their excellent curing properties and ease of handling, epoxy resins are used in wide fields of adhesion, casting, encapsulation, lamination, molding, coating, and the like.

In general, epoxy resins which have been industrially produced and used have a molecular weight distribution in their main component itself, and are mixtures (compositions) of many components containing various impurities. The majority of these impurities are brought in from raw materials of the epoxy resin, or produced by side-reactions or the like in the production thereof and remain in the resin.

Epoxy resin compositions used in encapsulation, adhesion or the like of electrical and electronic parts have conventionally required a small content of impurities. That is, it is known that impurities in an epoxy resin composition have an adverse effect, such as deterioration of electrical insulating property or heat resistance of the cured resin, corrosion of lead wires or the like. In particular, in the case that an epoxy resin composition is used as an encapsulant resin of semiconductor integrated circuit, high purity is essential, and an acceptable amount of impurities is decreasing as the degree of integration of semiconductor circuit increases. Among various impurities, ionic impurities such as halogen compounds are considered to give most adverse effect, and an effort has been continued to exclude those impurities as much as possible. However, in recent years, it has also been required to decrease impurities other than ionic impurities.

An epoxy resin composition obtained by the reaction of 4,4'-dihydroxy-3,3',5,5'-tetramethylbiphenyl represented by the following structural formula (3):

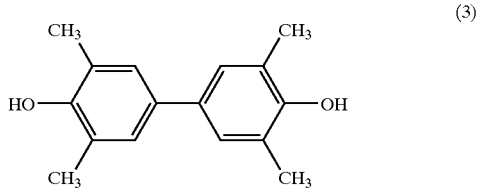

and an epihalohydrin, hereinafter referred to as "tetramethylbiphenyl type epoxy resin composition", has excellent characteristics, such as high heat resistance, lowmelt viscosity, low stress, high adhesion, low moisture absorption and the like, and therefore is widely used as a resin for semiconductor encapsulant.

An attempt has been made to decrease ionic impurities even in the epoxy resin composition of this type, and an epoxy resin composition having a decreased amount of ionic impurities is already produced industrially.

However, since the tetramethylbiphenyl type epoxy resin composition is mainly used for encapsulation of the most advanced semiconductors, further improvement has been required in its characteristics.

In general, 4,4'-dihydroxy-3,3',5,5'-tetramethylbiphenyl is produced by oxidative coupling of 2,6-xylenol. In the production, various by-products, such as tetramethyldiphenoquinone represented by the following structural formula (4):

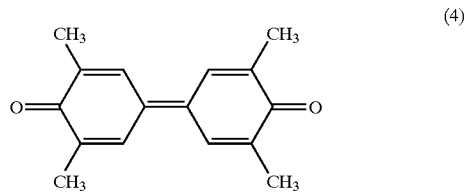

and a phenol compound represented by the following structural formula (2):

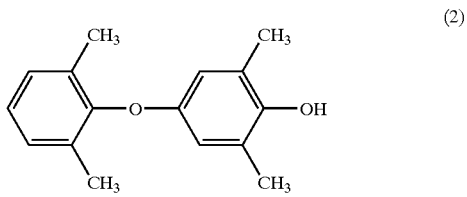

are produced by side-reactions or the like, and included as impurities in the product 4,4'-dihydroxy-3,3',5,5'-tetramethylbiphenyl.

Japanese Patent Application Laid-open No. Sho 61-268641 describes a production process whereby the by-product tetramethyldiphenoquinone can be decreased. However, tetramethyldiphenoquinone and/or the phenol compound represented by the structural formula (2) usually remain in industrially available 4,4'-dihydroxy-3,3',5,5'-tetramethylbiphenyl products.

SUMMARY OF THE INVENTION

The present invention has an object to provide a high performance epoxy resin composition useful in electrical and electronic fields and the like, a process for producing the high performance epoxy resin composition, and a curable epoxy resin composition using the high performance epoxy resin composition.

As a result of various investigations to solve the above-mentioned problem, the present inventors have found that a tetramethylbiphenyl type epoxy resin composition having a low content of specific impurities has excellent heat resistance and electric characteristics and the like, and also have found that the tetramethylbiphenyl type epoxy resin composition having a low content of specific impurities can be obtained by using raw material having a low content of such specific impurities. As a result, the object has been attained.

The present invention includes:

(1) a tetramethylbiphenyl type epoxy resin composition comprising an epoxy resin composition obtained by reacting 4,4'-dihydroxy-3,3',5,5'-tetramethylbiphenyl and an epihalohydrin in the presence of an alkali metal compound, wherein said composition has a content of tetramethyldiphenoquinone of 0.5% by weight or less;

(2) a tetramethylbiphenyl type epoxy resin composition comprising an epoxy resin composition obtained by reacting 4,4'-dihydroxy-3,3',5,5'-tetramethylbiphenyl and an epihalohydrin in the presence of an alkali metal compound, wherein said composition has a content of a glycidyl compound represented by the following structural formula (1):

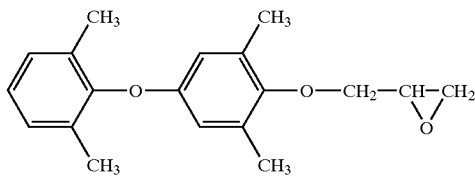

(1)

of 0.5% by weight or less;
(3) a tetramethylbiphenyl type epoxy resin composition, comprising an epoxy resin composition obtained by reacting 4,4'-dihydroxy-3,3',5,5'-tetramethylbiphenyl and an epihalohydrin in the presence of an alkali metal compound, wherein the total content of tetramethyldiphenoquinone and the glycidyl compound represented by the above structural formula (1) is 0.8% by weight or less;
(4) a process for producing a tetramethylbiphenyl type epoxy resin composition having a content of tetramethyldiphenoquinone of 0.5% by weight or less, comprising reacting 4,4'-dihydroxy-3,3',5,5'-tetramethylbiphenyl having a content of tetramethyldiphenoquinone of 0.5% by weight or less and an epihalohydrin in the presence of an alkali metal compound;
(5) a process for producing a tetramethylbiphenyl type epoxy resin composition having a content of a glycidyl compound represented by the following structural formula (1):

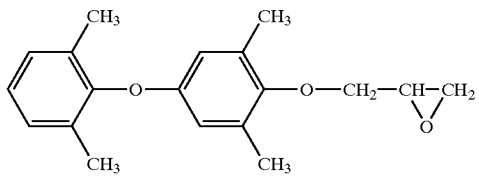

(1)

of 0.5% by weight or less, comprising reacting 4,4'-dihydroxy-3,3',5,5'-tetramethylbiphenyl having a content of the phenol compound represented by the structural formula (2) of 0.5% by weight or less, and an epihalohydrin in the presence of an alkali metal compound;
(6) a process for producing a tetramethylbiphenyl type epoxy resin composition having the total content of tetramethyldiphenoquinone and the glycidyl compound represented by the above structural formula (1) of 0.8% by weight or less, comprising reacting 4,4'-dihydroxy-3,3',5,5'-tetramethylbiphenyl having the total content of the tetramethyldiphenoquinone and the phenol compound represented by the above structural formula (2) of 0.8% by weight or less, and an epihalohydrin in the presence of an alkali metal compound; and
(7) a curable epoxy resin composition comprising a blend of the tetramethylbiphenyl type epoxy resin composition as described in any one of the aforementioned items (1) to (3), and an epoxy resin hardener for the epoxy resin, as essential components.

DESCRIPTION OF PREFERRED EMBODIMENTS

The high performance epoxy resin composition of the present invention is an epoxy resin composition obtained from 4,4'-dihydroxy-3,3',5,5'-tetramethylbiphenyl and an epihalohydrin. The amount of tetramethyldiphenoquinone as an impurity in the resin is 0.5% by weight or less, preferably 0.3% by weight or less, more preferably 0.2% by weight or less.

The amount of the glycidyl compound represented by the structural formula (1):

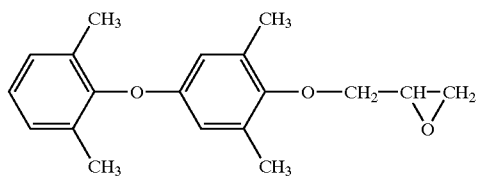

(1)

as an impurity in the resin is 0.5% by weight or less, preferably 0.3% by weight or less, more preferably 0.2% by weight or less. Further, the total amount of the tetramethyldiphenoquinone and the glycidyl compound represented by the above structural formula (1) is 0.8% by weight or less, preferably 0.5% by weight or less, more preferably 0.3% by weight or less.

If the content of tetramethyldiphenoquinone is too large, electric characteristics or the like of an epoxy resin cured product deteriorate. Further, if the content of the glycidyl compound represented by the structural formula (1) is too large, heat resistance or the like of an epoxy resin cured product deteriorates.

Production process of the high performance epoxy resin composition of the present invention is not particularly limited so long as the content of tetramethyldiphenoquinone and/or the glycidyl compound represented by the structural formula (1) is in the specified range. However, if 4,4'-dihydroxy-3,3',5,5'-tetramethylbiphenyl having a large tetramethyldiphenoquinone content is used, tetramethyldiphenoquinone tends to remain in the resin in the conventional production processes of an epoxy resin composition, and a specific purification step is required to remove it. For this reason, it is particularly advantageous to employ the production process of the high performance epoxy resin composition of the present invention that uses raw materials having a small tetramethyldiphenoquinone content.

Further, the glycidyl compound represented by the above structural formula (1) is formed from the phenol compound represented by the structural formula (2) which may be contained in the raw material 4,4'-dihydroxy-3,3',5,5'-tetramethylbiphenyl, through glycidylation with epihalohydrin during production of an epoxy resin composition, and a special expensive purification step is required in order to remove it from the epoxy resin composition produced. For this reason, it is particularly advantageous to employ the production process of the high performance epoxy resin composition of the present invention that uses raw materials having a small content of the phenol compound represented by the structural formula (2).

The production process of the tetramethylbiphenyl type high performance epoxy resin composition according to the present invention comprises reacting 4,4'-dihydroxy-3,3',5,5'-tetramethylbiphenyl in which the content of tetramethyldiphenoquinone and/or the phenol compound represented by the structural formula (2) as impurities is in the specified range, and an epihalohydrin in the presence of an alkali metal compound.

Production process of 4,4'-dihydroxy-3,3',5,5'-tetramethylbiphenyl as a raw material is not particularly limited. However, the content of tetramethyldiphenoquinone should be 0.5% by weight or less, preferably 0.3% by weight or less, more preferably 0.2% by weight or less.

Further, the content of the phenol compound represented by the above structural formula (2) should be 0.5% by weight or less, preferably 0.3% by weight or less, more preferably 0.2% by weight or less.

The total content of the tetramethyldiphenoquinone and the phenol compound represented by the above structural formula (2) is 0.8% by weight or less, preferably 0.5% by weight or less, more preferably 0.3% by weight or less.

If the content of tetramethyldiphenoquinone is too large, the content of tetramethyldiphenoquinone in the epoxy resin composition produced also increases. Further, if the content of the phenol compound represented by the structural formula (2) is too large, the content of the glycidyl compound represented by the structural formula (1) in the epoxy resin composition produced also increases.

Method of decreasing the content of tetramethyldiphenoquinone or the phenol compound represented by the above structural formula (2) in 4,4'-dihydroxy-3,3',5,5'-tetramethylbiphenyl as a raw material is not particularly limited, but optimization of production reaction conditions or purification operation such as heat treatment, extraction, washing or recrystallization is generally used.

When 4,4'-dihydroxy-3,3',5,5'-tetramethylbiphenyl having a small content of tetramethyldiphenoquinone and/or the phenol compound represented by the structural formula (2), and an epihalohydrin are reacted in the presence of an alkali metal compound, a high performance epoxy resin composition having a small content of tetramethyldiphenoquinone and/or the glycidyl compound represented by the structural formula (1) is obtained.

The reaction can be conducted under general conditions, but the representative example of the reaction is described in detail below.

First, 4,4'-dihydroxy-3,3',5,5'-tetramethylbiphenyl is dissolved in an epihalohydrin in an amount of 3-20 moles per mole of phenolic hydroxyl groups in 4,4'-dihydroxy-3,3',5,5'-tetramethylbiphenyl. Next, while stirring the resulting solution, an alkali metal compound in an amount of 0.9-2 moles per mole of the phenolic hydroxyl groups is added to the solution in the form of a solid or an aqueous solution, and reaction is conducted. This reaction can be conducted under atmospheric pressure or reduced pressure. The reaction temperature is generally about 30-105° C. in the case of the reaction under atmospheric pressure and about 30-80° C. in the case of the reaction under reduced pressure. During the reaction, the reaction liquid is subjected to azeotropy while maintaining a predetermined temperature as required, a condensate obtained by cooling volatilized vapor is subjected to oil/water separation, and water is removed from the reaction system by a method of returning an oil component from which water has been removed, to the reaction system. The alkali metal compound is intermittently or continuously added in small portions over 1-8 hours in order to suppress rapid reaction. The overall reaction time is generally about 1-10 hours.

After completion of the reaction, insoluble by-product salts are either removed by filtration or by water washing, and unreacted epihalohydrin is then distilled off under reduced pressure, thereby obtaining the desired epoxy resin composition.

The epihalohydrin generally used in this reaction is epichlorohydrin or epibromohydrin. Further, the alkali metal compound generally used is alkali metal hydroxide, for example, NaOH or KOH.

Further, this reaction may use catalysts, for example, quaternary ammonium salts such as tetramethylammonium chloride or tetraethylammonium bromide; tertiary amines such as benzyldimethylamine or 2,4,6-tris(dimethylaminomethyl)phenol; imidazoles such as 2-ethyl-4-methylimidazole or 2-phenylimidazole; phosphonium salts such as ethyltriphenyl phosphonium iodide; and phosphines such as triphenyl phosphine.

This reaction may also use inert organic solvents, for example, alcohols such as ethanol or isopropanol; ketones such as acetone or methyl ethyl ketone; ethers such as dioxane or ethylene glycol dimethyl ether; and aprotic polar solvents such as dimethylsulfoxide or dimethylformamide.

In the case that a saponifiable halogen content in an epoxy resin composition thus obtained is too large, the epoxy resin composition may be re-treated, thereby obtaining a purified epoxy resin composition having sufficiently decreased saponifiable halogen content. Specifically, the crude epoxy resin composition is re-dissolved in an inert organic solvent such as 2-propanol, methyl ethyl ketone, methyl isobutyl ketone, toluene, xylene, dioxane, propylene glycol monomethyl ether or dimethylsulfoxide, an alkali metal hydroxide is added to the solution in the form of a solid or an aqueous solution, and re-cyclization reaction is conducted at a temperature of about 30-120° C. for 0.5-8 hours. Thereafter, excess alkalimetal hydroxide or by-product salts are removed by, for example, water washing, and the organic solvent is further distilled of f under reduced pressure, thereby obtaining a purified epoxy resin composition.

The content of tetramethyldiphenoquinone in the raw material 4,4'-dihydroxy-3,3',5,5'-tetramethylbiphenyl and the product epoxy resin composition can be measured with gas chromatography, liquid chromatography, UV absorption intensity method or the like, but UV absorption intensity method is preferred in that measurement can be made with good precision in an easy operation. In the UV absorption intensity method, a material to be measured is dissolved in a solvent such as THF, and an absorption intensity at 400–450 nm is measured. The content of the desired tetramethyldiphenoquinone can be quantitatively determined from a calibration curve prepared using pure tetramethyldiphenoquinone standards separately provided.

The content of the phenol compound represented by the above structural formula (2) in the raw material 4,4'-dihydroxy-3,3',5,5'-tetramethyl-biphenyl and the content of the glycidyl compound represented by the above structural formula (1) in the epoxy resin composition can be measured with a gas chromatography, liquid chromatography or the like, but a gas chromatography method is preferred in that measurement can be made with good precision in an easy operation.

The curable epoxy resin composition of the present invention comprises a blend of the tetramethylbiphenyl type high performance epoxy resin composition of the present invention and an epoxy resin hardener, as the essential components.

Epoxy resins other than the high performance epoxy resin composition of the present invention can be compounded in the curable epoxy resin composition of the present invention. The epoxy resins that can be used together are not particularly limited and can be any epoxy resin so long as it is an epoxy resin other than the high performance epoxy resin of the present invention.

Examples of the other epoxy resins include epoxy resins produced from various phenolic compounds, such as various phenols, e.g., bisphenol A, bisphenol F, bisphenol AD, tetrabutylbisphenol A, hydroquinone, methylhydroquinone, dimethylhydroquinone, dibutylhydroquinone, resorcin, methyl resorcin, biphenol, tetramethylbiphenol, dihydroxynaphthalene, dihydroxydiphenyl ether, dihydroxystilbenes, phenol novolak resin, cresol novolak resin, bisphenol A novolak resin, dicyclopentadiene phenolic resin, phenol aralkyl resin, naphthol novolak resin, terpene phenolic resin, heavy oils modified phenolic resin, or brominated phenol novolak resin and polyhydric phenolic resins obtained by condensation reaction of various phenols and various aldehydes, e.g., hydroxybenzaldehyde, crotonaldehyde, or glyoxal, with an epihalohydrin; epoxy resins produced from various amine compounds, e.g., diaminodiphenylmethane, aminophenol or xylenediamine with an epihalohydrin; and epoxy resins produced from carboxylic acids, e.g., methylhexahydrophthalic acid or dimer acid with an epihalohydrin.

In producing the high performance epoxy resin composition of the present invention, 4,4'-dihydroxy-3,3',5,5'-tetramethylbiphenyl and a phenol compound other than 4,4'-dihydroxy-3,3',5,5'-tetramethylbiphenyl may be mixed and simultaneously reacted with an epihalohydrin to produce a mixture of the high performance epoxy resin composition of the present invention and the other epoxy resin.

The proportion of the high performance epoxy resin composition of the present invention in the curable epoxy resin composition of the present invention is 10–100% by weight, preferably 20–100% by weight, of the whole epoxy resin components. If the proportion of the high performance epoxy resin composition of the present invention is smaller, excellent characteristics of the tetramethylbiphenyl type epoxy resin are not exhibited.

A hardener for epoxy resins is compounded as an essential component in the curable epoxy resin composition of the present invention, and any hardener for an epoxy resin can be used.

Examples of the hardener that can be used include various polyhydric phenols, such as, e.g., bisphenol A, bisphenol F, bisphenol AD, tetrabutylbisphenol A, hydroquinone, resorcin, methylresorcin, biphenol, tetramethylbiphenol, dihydroxynaphthalene, dihydroxydiphenyl ether, phenol novolak resin, cresol novolak resin, bisphenol A novolak resin, dicyclopentadiene phenolic resin, terpene phenol resin, naphthol novolak resin, heavy oil modified phenolic resin and brominated phenol novolak resin, or various phenolic resins, such as polyhydric phenolic resins obtained by condensation reaction of various phenols and various aldehydes, e.g., hydroxybenzaldehyde, crotonaldehyde or glyoxal; acid anhydrides, such as methyltetrahydrophthalic anhydride, hexahydrophthalic anhydride, pyromellitic anhydride or methylnadic acid; and amines, such as diethylene triamine, isophorone diamine, diaminodiphenyl methane, diaminodiphenyl sulfone or dicyandiamide.

Examples of hardeners of the type that initiate polymerization of epoxy groups include phosphine compounds such as triphenylphosphine; phosphonium salts such as tetraphenylphosphonium tetraphenylborate; imidazoles such as 2-methyl imidazole, 2-phenyl imidazole, 2-ethyl-4-methyl imidazole, 2-undecyl imidazole, 1-cyanoethyl-2-methyl imidazole or 2,4-dicyano-6-[2-methylimidazolyl-(1)]-ethyl-S-triazine; imidazolium salts such as 1-cyanoethyl-2-undecylimidazolium trimellitate, 2-methylimidazolium isocyanurate, 2-ethyl-4-methylimidazolium tetraphenylborate or 2-ethyl-1,4-dimethylimidazolium tetraphenylborate; amines such as 2,4,6-tris(dimethylaminomethyl)phenol or benzyl dimethylamine; ammonium salts such as triethylammonium tetraphenylborate; diazabicyclo compounds such as 1,5-diazabicyclo(5,4,0)-7-undecene or 1,5-diazabicyclo(4,3,0)-5-nonene; and tetraphenylborates, phenol salts, phenol novolak salts or 2-ethylhexanoates of those diazabicyclo compounds.

Further, triflic acid salts, boron trifluoride ether complex compounds, metal fluoroboron complex salts, bis(perfluoroalkylsulfonyl)methane metal salts, aryl diazonium compounds, aromatic onium salts, dicarbonyl chelates of Groups IIIa–Va elements, thiopyrylium salts, VIb elements in the form of $MF_6^-$ wherein M is selected from phosphorus, antimony and arsenic, arylsulfonium complex salts, aromatic iodonium complex salts, aromatic sulfonium complex salts, bis[4-(diphenylsulfonio)phenyl]sulfide-bis-hexafluoro metal salts (for example, phosphates, arsenates, antimonates or the like), aryl sulfonium complex salts, and aromatic sulfonium or iodonium salts of halogen-containing complex ions, and the like can be used. These hardeners for epoxy resins may be used alone or as mixtures of two kinds or more thereof.

In the case of using a compound having a group that reacts with an epoxy group, the proportion of the hardener used in the curable epoxy resin composition of the present invention is such that the sum of groups that react with epoxy groups in the whole hardener components is preferably 0.5–2.0 moles, more preferably 0.7–1.5 moles, per one mole of epoxy groups in the total epoxy resin components.

In the case of using a hardener of the type that initiates polymerization of epoxy groups, as the hardener component, the proportion thereof is preferably 0.1–10 parts by weight, more preferably 0.3–5 parts by weight, per 100 parts by weight of the total epoxy resin components.

If necessary, inorganic fillers, reinforcing fibers, cure accelerators, coupling agents, plasticizers, pigments, solvents, flame retardants and the like can appropriately be compounded in the curable epoxy resin composition of the present invention.

Kinds of the inorganic filler are, for example, fused silica, crystalline silica, glass powder, alumina and calcium carbonate. The shape thereof is a crushed form or a spherical form. Various inorganic fillers are used alone or as mixtures of two kinds or more thereof. The amount thereof used is 30–95% by weight, preferably 50–95% by weight, more preferably 70–93% by weight, of the whole composition.

The cure accelerator is a compound that accelerates the reaction between epoxy groups in the epoxy resin and active groups in the hardener.

Examples of the cure accelerator include phosphine compounds, such as tributyl phosphine, triphenyl phosphine, tris(dimethoxyphenyl)phosphine, tris(hydroxypropyl) phosphine and tris(cyanoethyl)phosphine; phosphonium salts, such as tetraphenylphosphonium tetraphenylborate, methyltributylphosphonium tetraphenylborate and methyltricyanoethyl phosphonium tetraphenylborate; imidazoles, such as 2-methyl imidazole, 2-phenyl imidazole, 2-ethyl-4-methyl imidazole, 2-undecyl imidazole, 1-cyanoethyl-2-methyl imidazole, 1,4-dicyano-6-[2-methylimidazolyl-(1)]-ethyl-S-triazine and 2,4-dicyano-6-[2-undecylimidazolyl-(1)]-ethyl-S-triazine; imidazolium salts, such as 1-cyanoethyl-2-undecylimidazolium trimellitate, 2-methylimidazolium isocyanurate, 2-ethyl-4-methylimidazolium tetraphenylborate and 2-ethyl-1,4-dimethylimidazolium tetraphenylborate; amines, such as 2,4,6-tris(dimethylaminomethyl)phenol, benzyl dimethylamine, tetramethylbutyl guanidine, N-methyl piperazine and 2-dimethylamino-1-pyrroline; ammonium salts, such as triethylammonium tetraphenylborate; diazabicyclo compounds, such as 1,5-diazabicyclo(5,4,0)-7-undecene, 1,5-diazabicyclo(4,3,0)-5-nonene and 1,4-diazabicyclo(2,2,2)-octane; and tetraphenylborates, phenol salts, phenol novolak salts and 2-ethylhexanoates of those diazabicyclo compounds.

Of the compounds as the cure accelerator, tertiary amines, phosphine compounds, imidazole compounds, diazabicyclo compounds and their salts are preferred. These cure accelerators are used alone or as mixtures of two kinds or more thereof, and the amount thereof used is 0.1–7% by weight to the total epoxy resin components.

Examples of the flame retardant include halogen type flame retardants such as brominated epoxy resin, antimony compounds such as antimony trioxide, phosphorus type flame retardants such as phosphoric acid esters or phosphines, nitrogen type flame retardants such as melamine derivatives, and inorganic flame retardants such as aluminum hydroxide and magnesium hydroxide.

The high performance epoxy resin composition of the present invention has excellent heat resistance, electric characteristics and the like, and is therefore useful in electrical and electronic fields, and the like. The production process of the high performance epoxy resin composition of the present invention can easily produce the high performance epoxy resin composition. Further, the curable epoxy resin composition of the present invention has excellent heat resistance, electric characteristics and the like, and is therefore useful in electrical and electronic fields, and the like.

EXAMPLES

The present invention is further described in detail below by the following the examples and comparative examples of the high performance epoxy resin composition, production process thereof, and curable epoxy resin composition of the present invention.

Examples 1–3 and Comparative Examples 1 and 2

Into a 2 liters three-necked flask equipped with a thermometer, a stirrer and a cooling pipe were charged 121 g of 4,4'-dihydroxy-3,3',5,5'-tetramethylbiphenyl having different purities and containing tetramethyldiphenoquinone and the phenol compound represented by the above-mentioned structural formula (2) in respective amounts shown in Table 1, 555 g of epichlorohydrin and 200 g of 2-propanol, and temperature was elevated to 50° C. to dissolve them. To the flask, 91 g of 48.5 wt % aqueous sodium hydroxide solution were added dropwise over 1 hour. During the addition, temperature was gradually elevated such that the temperature in the system reached 70° C. at the time of completion of the addition. Thereafter, the system was maintained at 70° C. for 30 minutes to conduct reaction. After completion of the reaction, the reaction mixture was washed with water to remove by-product salts and excess sodium hydroxide. Excess epichlorohydrin and 2-propanol were distilled off under reduced pressure from the product to obtain a crude epoxy resin composition.

This crude epoxy resin composition was dissolved in 250 g of methyl isobutyl ketone, and 2 g of 48.5 wt % aqueous sodium hydroxide solution was added thereto to conduct reaction at a temperature of 70° C. for 1 hour. After completion of the reaction, sodium primary phosphate was added to neutralize excess sodium hydroxide, followed by water washing to remove by-product salts. Methyl isobutyl ketone was completely removed under reduced pressure to obtain the desired epoxy resin composition.

Content of tetramethyldiphenoquinone, content of the glycidyl compound represented by the structural formula (1), epoxy equivalent and color tint of these epoxy resin compositions are shown in Table 1.

Examples 4–6 and Comparative Examples 3 and 4

Each curable epoxy resin composition was formulated by using each of the tetramethylbiphenyl type epoxy resin compositions produced in Examples 1–3 and Comparative Examples 1 and 2, as an epoxy resin component; a phenol aralkyl resin as a hardener component; fused silica powder as an inorganic filler, triphenyl phosphine as a cure accelerator, carnauba wax as a release agent, and an epoxy silane as a silane coupling agent, as shown in Table 2.

Next, each blend obtained was melt mixed at 70–130° C. for 5 minutes using a mixing roll. Each molten mixture obtained was taken out in the form of a sheet, and each sheet was then crushed to obtain each molding material.

Each molding material was molded with a low pressure transfer molding press at a mold temperature of 180° C. for a molding time of 90 seconds to obtain each test piece, and each test piece was post-cured at 180° C. for 5 hours. Glass transition temperature after post-curing and volume resistivity at 23° C. and 150° C. of each molding material is shown in Table 2.

The curable epoxy resin compositions produced in Examples 4–6 were excellent in heat resistance and electric characteristics as compared with the curable epoxy resin compositions produced in Comparative Examples 3 and 4.

TABLE 1

|  | Example 1 | Example 2 | Example 3 | Comparative Example 1 | Comparative Example 2 |
| --- | --- | --- | --- | --- | --- |
| 4,4'-Dihydroxy-3,3',5,5'-tetramethylbiphenyl | A | B | C | D | E |
| Tetramethyldiphenoquinone content *1 (wt %) | 0.45 | 0.22 | 0.12 | 0.89 | 0.59 |
| Content of phenol compound represented by structural formula(2) *2 (wt %) | 0.31 | 0.09 | 0.10 | 0.58 | 1.02 |
| Analytical results of epoxy resin composition |  |  |  |  |  |
| Tetramethyldiphenoquinone content *1 (wt %) | 0.23 | 0.16 | 0.09 | 0.62 | 0.43 |
| Content of glycidyl compound represented by structural formula(1) *2 (wt %) | 0.30 | 0.10 | 0.11 | 0.57 | 0.99 |

TABLE 1-continued

|  | Example 1 | Example 2 | Example 3 | Comparative Example 1 | Comparative Example 2 |
|---|---|---|---|---|---|
| Epoxy equivalent (q/eq) | 186 | 185 | 185 | 187 | 187 |
| Color ting (%) | Pale purple | Yellow | Yellow | Dark purple | Dark purple |

*1: Measured by UV absorption intensity method (THF solution, 415 nm)
*2: Measured with gas chromatography

TABLE 2

|  | Example 4 | Example 5 | Example 6 | Comparative Example 3 | Comparative Example 4 |
|---|---|---|---|---|---|
| Formulation of curable epoxy resin composition (parts by weight) | | | | | |
| Epoxy resin | Example 1 | Example 2 | Example 3 | Comparative Example 1 | Comparative Example 2 |
| Amount blended | 100 | 100 | 100 | 100 | 100 |
| Epoxy resin hardener *1 Amount blended | 90 | 90 | 90 | 90 | 90 |
| Inorganic filler *2 | 770 | 770 | 770 | 770 | 770 |
| Triphenyl phosphine | 1 | 1 | 1 | 1 | 1 |
| Carnauba wax | 1 | 1 | 1 | 1 | 1 |
| Epoxysilane *3 | 1 | 1 | 1 | 1 | 1 |
| Curing properties | | | | | |
| Glass transition temperature *4 (° C.) | 125 | 127 | 127 | 118 | 115 |
| Volume resistivity 23° C. (Ω · cm) 150° C. | $1.8 \times 10^{15}$ $6.2 \times 10^{13}$ | $2.8 \times 10^{15}$ $8.4 \times 10^{13}$ | $2.9 \times 10^{15}$ $8.0 \times 10^{13}$ | $4.3 \times 10^{14}$ $4.5 \times 10^{12}$ | $6.7 \times 10^{14}$ $5.8 \times 10^{12}$ |

*1: Phenol aralkyl resin (trade name: MIREX XL225-3L, & product of Mitsui Chemical Co., hydroxyl equivalent: 170)
*2: Fused silica powder (trade name: RD-8, a product of Tatsumori K.K.)
*3: Epoxy silane (trade name: KBM-403, a product of Shin-Etsu Chemical Industry Co.)
*4: Determined from inflection point on TMA curve The high performance epoxy resin composition of the present invention is excellent in heat resistance, electrical characteristics and the like, and is therefore useful in electrical and electronic fields and the like. The production process of a high performance epoxy resin composition of the present invention can easily produce the high performance epoxy resin composition. Further, the curable epoxy resin composition of the present invention is excellent in heat resistance, electric characteristics and the like, and is therefore useful in electrical and electronic fields and the like.

What is claimed is:

1. A tetramethylbiphenyl type epoxy resin composition comprising an epoxy resin composition obtained by reacting 4,4'-dihydroxy-3,3',5,5'-tetramethylbiphenyl and an epihalohydrin in the presence of an alkali metal compound, wherein said composition has a content of tetramethyldiphenoquinone of 0.5% by weight or less and a content of a glycidyl compound represented by the following structural formula (1):

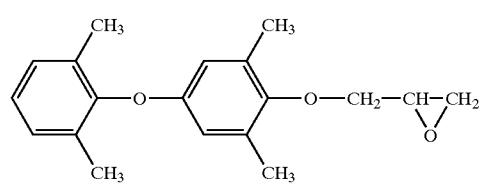

(1)

of 0.5% by weight or less.

2. The tetramethylbiphenyl type epoxy resin composition as claimed in claim 1, wherein the total content of the tetramethyldiphenoquinone and the glycidyl compound represented by the structural formula (1) is 0.8% by weight or less.

3. A process for producing a tetramethylbiphenyl type epoxy resin composition having a content of tetramethyldiphenoquinone of 0.5% by weight or less and a content of a glycidyl compound represented by the following structural formula (1):

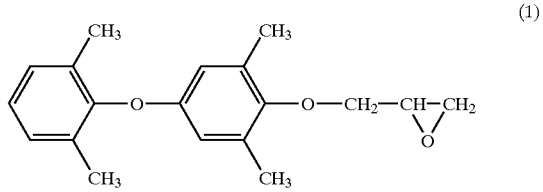

(1)

of 0.5% by weight or less, comprising reacting 4,4'-dihydroxy-3,3',5,5'-tetramethylbiphenyl having a content of tetramethyldiphenoquinone of 0.5% by weight or less and a content of a phenol compound represented by the following structural formula (2):

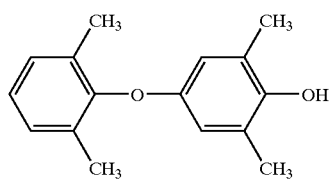

(2)

of 0.5% by weight or less, and an epihalohydrin in the presence of an alkali metal compound.

4. The process for producing a tetramethylbiphenyl type epoxy resin composition as claimed in claim 3, wherein the 4,4'-dihydroxy-3,3',5,5'-tetramethylbiphenyl has a total content of the tetramethyldiphenoquinone and the phenol compound represented by the structural formula (2) of 0.8% by weight or less, and the total content of the tetramethyldiphenoquinone and the glycidyl compound represented by the structural formula (1) in the tetramethylbiphenyl type epoxy resin composition produced is 0.8% by weight or less.

5. A curable epoxy resin composition comprising a blend of the tetramethylbiphenyl type epoxy resin composition as claimed in claim 1 or 2, and a hardener for the epoxy resin, as essential components.

* * * * *